United States Patent
Sbuell et al.

(10) Patent No.: US 8,076,970 B2
(45) Date of Patent: Dec. 13, 2011

(54) ADAPTIVE DEMODULATOR

(75) Inventors: Richard Sbuell, Graz (AT); Admir Alihodzic, Graz (AT); Martin Joechlinger, St. Michael (AT)

(73) Assignee: Infineon Technologies AG, Neubiberg (DE)

( * ) Notice: Subject to any disclaimer, the term of this patent is extended or adjusted under 35 U.S.C. 154(b) by 34 days.

(21) Appl. No.: 12/481,864

(22) Filed: Jun. 10, 2009

(65) Prior Publication Data

US 2010/0315160 A1 Dec. 16, 2010

(51) Int. Cl.
*H03D 1/00* (2006.01)

(52) U.S. Cl. .......................................... 329/365; 331/109

(58) Field of Classification Search .................. 329/365; 331/109
See application file for complete search history.

(56) References Cited

U.S. PATENT DOCUMENTS

| | | | |
|---|---|---|---|
| 6,778,070 B1 * | 8/2004 | Thomas | 340/10.1 |
| 2003/0025566 A1 * | 2/2003 | Rogers | 331/109 |
| 2006/0049263 A1 * | 3/2006 | Ou et al. | 235/492 |

* cited by examiner

*Primary Examiner* — Joseph Chang
(74) *Attorney, Agent, or Firm* — Dickstein Shapiro LLP

(57) ABSTRACT

An adaptive demodulator for a contactless device, including a rectifier configured to rectify a voltage which is dependent on a signal received by the contactless device, and a voltage regulator coupled to the rectifier and configured to adjust the voltage to be within a voltage window.

25 Claims, 5 Drawing Sheets

ADAPTIVE DEMODULATOR

BACKGROUND

A contactless card or proximity card is a specific type of integrated circuit card ("IC card"), namely, a contactless integrated circuit device that can receive an input which is processed and subsequently delivered as an output. Proximity cards operate on the basis of communication by an electromagnetic field with a read and/or write interrogating device, generically referred to as a reader.

In proximity card applications, the reader typically transmits a carrier signal which creates an electromagnetic field. This carrier signal can serve on the one hand to power the contactless card, which is derived by converting the electromagnetic field into a DC voltage, and on the other hand to initiate a communication between the card and the reader. Both the contactless card and the reader of such applications each employ a demodulator to recover the information content from the carrier signal. Established communication protocols between the reader and the contactless card have been defined, for example, by ISO (International Organization for Standardization) 14443, Type A/B/C.

Conventional demodulators that are being used by both contactless cards and readers in these types of applications are fully analog circuit structures. As a result, the performance of the demodulator circuit is dependent on temperature as well as technology variances. Additionally, these analog circuit implementations make it difficult for system designers to apply even small concept changes to the applications.

DETAILED DESCRIPTION

Figure 1:
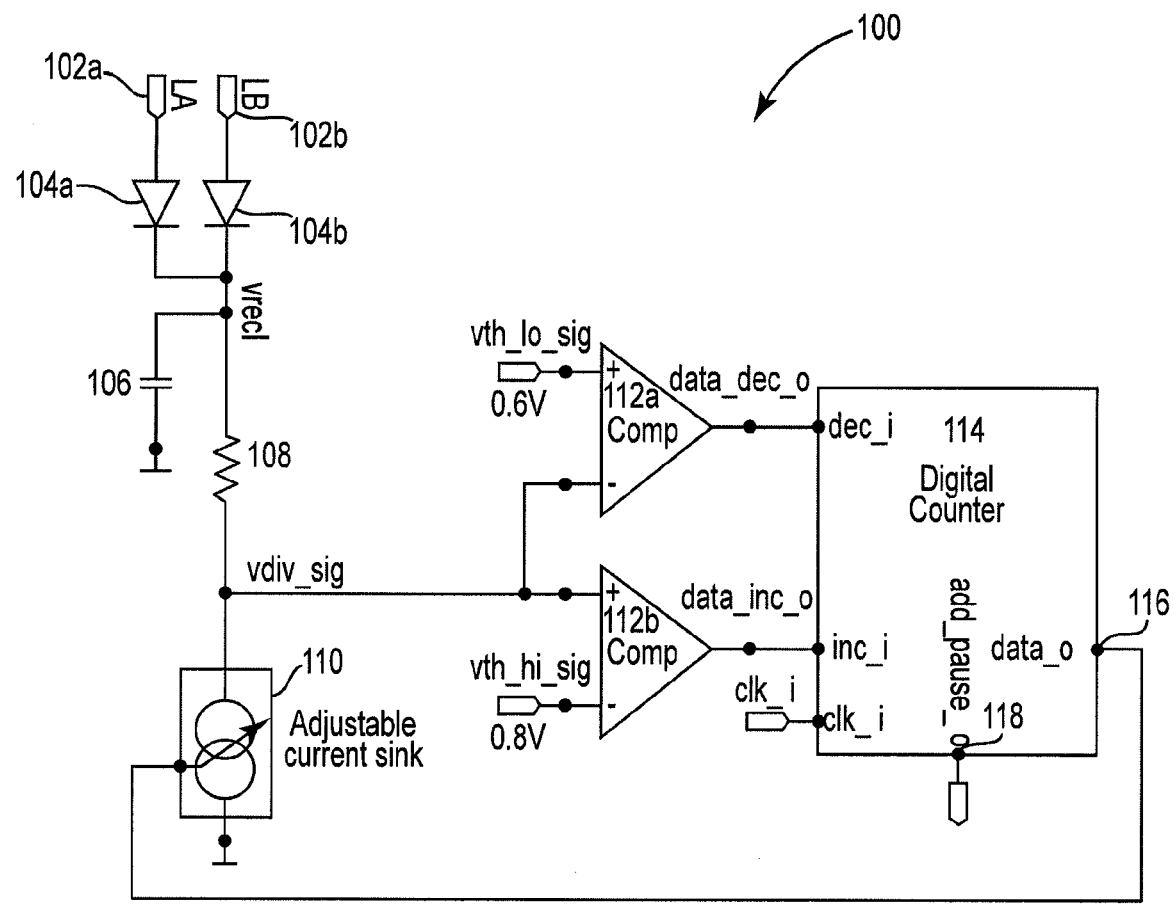
FIG. 1 illustrates a block diagram in accordance with an exemplary embodiment.

FIG. 1 is a block diagram of demodulator 100 of a contactless device in accordance with an exemplary embodiment. As shown, demodulator 100 includes two antenna connectors 102a and 102b configured to receive an analog input transmitted by a contactless card, a card reader or the like. The antenna 102a, 102b is coupled to a rectifiers 104a, 104b, which in the exemplary embodiment is two diodes. Of course, it should be understood by those of ordinary skill in the art that any type of electronic components capable of rectifying an analog signal may be used in accordance with the present invention. The rectifier 104a, 104b is configured to rectify the voltage that is dependent on a signal received by the antenna 102a, 102b of the contactless device.

A filter capacitor 106 provided to reduce any residue of the received analog signal may further be coupled between the output of rectifiers 104a, 104b and ground. The output of the rectifiers is then coupled to a series resistor 108 whose output voltage can be adjusted by high speed adjustable current sink 110. More particularly, the output voltage of the series resistor, referred to as "Vdiv_sig", can be controlled by adjusting the amount of current sunk by adjustable current sink 110. In alternative embodiments of the application, an operational amplifier can be used in lieu of adjustable current sink 110 while maintaining the spirit and scope of the application.

Employing adjustable current sink 110, voltage Vdiv_sig can be adjusted to be within a certain voltage window defined by voltage thresholds "Vth_hi_sig" and "Vth_lo_sig", defining upper and lower limits, respectively. (By way of example, Vth_lo_sig can equal 0.6 volts and Vth_hi_sig can equal 0.8 volts.) These values, however, are used solely to provide an example for this embodiment. Moreover, the sensitivity of the demodulator is controlled by the size, i.e., voltage thresholds, of the voltage window. The more narrow the voltage window, the more sensitive demodulator 100 will be, meaning the more frequently and/or quickly demodulator 100 will detect a change in the voltage signal received by antenna 102a, 102b. Additionally, as will be discussed in more detail with respect to FIG. 3, voltage thresholds Vth_lo_sig and Vth_hi_can be defined by a reference voltage generation circuit.

In order to drive voltage Vdiv_sig within the defined voltage window, voltage Vdiv_sig is input to an inverting input and a non-inverting input of two high speed comparators, respectively. Specifically, demodulator 100 comprises low threshold level comparator 112a and high threshold level comparator 112b. As shown in FIG. 1, low voltage threshold Vth_lo_sig is input to the non-inverting input of low threshold level comparator 112a and Vdiv_sig is input to the inverting input of low threshold level comparator 112a. As a result, when Vdiv_sig is lower than voltage threshold Vth_lo_sig, the output signal data_dec_o of low threshold level comparator 112a will be high signal, representative of a logical 1.

Conversely, high voltage threshold Vth_hi_sig is input to the inverting input of high threshold level comparator 112b and Vdiv_sig is input to the non-inverting input of this comparator 112b. As a result, when Vdiv_sig is greater than voltage threshold Vth_hi_sig, the output signal data_inc_o of high threshold level comparator 112b will be high, representative of a logical 1. It should be understood that when voltage Vdiv_sig is greater than Vth_lo_sig and lower than Vth_hi_sig, i.e., Vdiv_sig is within the voltage window defined by Vth_lo_sig and Vth_hi_sig, the output signals of both high speed comparators 112a and 112b will be low signals, representative of logical 0's.

In addition, the output of low threshold level comparator 112a and the output of high threshold level comparator 112b are each coupled to a digital counter 114. A clock signal configured to generate clock pulses is further input to digital counter 114. Digital counter 114 also comprises an output 116 coupled to adjustable current sink 110. As such, digital counter 114 is configured to output a data signal data_o via output 116 in order to control the amount of current sunk by the adjustable current sink 110. Although this feature will be discussed in more detail below with respect to the timing diagram in FIG. 2, generally, digital counter 114 will output a signal to adjustable current sink 110 based on the signals received from high speed comparators 112a and 112b, serving as a regulation loop for voltage Vdiv_sig. It is noted that although this exemplary embodiment employs a digital counter, the application is not in any way intended to be limited to this embodiment. Rather, any digital device or circuitry capable of adjusting the amount of current sunk by adjustable current sink 110 may be utilized for this purpose.

In operation, when Vdiv_sig is higher than Vth_hi_sig and output signal data_inc_o of high threshold level comparator 112b is a high signal, output signal data_o of digital counter 114 will adjust current sink 110 to increase the amount of current sunk, effectively decreasing voltage Vdiv_sig. Specifically, for each clock pulse, digital counter 114 will increase its counter value in accordance with the high output signal data_inc_o. Moreover, output signal data_o of digital counter 114 is directly dependent on the internal counter value. Therefore, as long as the counter value continues to increase at each clock pulse, adjustable current sink 110 also will continue to increase the amount of current sunk. Once Vdiv_sig is no longer greater than Vth_hi_sig, output signal data_inc_o will become low such that digital counter 114 will no longer increase its counter value at each clock pulse.

Alternatively, when Vdiv_sig is lower than Vth_lo_sig and output data_dec_o of low threshold level comparator 112a is high, digital counter 114 will decrease its counter value at each clock pulse. In a similar manner as discussed above, digital counter 114 will continue to decrease its internal counter value until Vdiv_sig is no longer lower than Vth_lo_sig. As should be understood, at each clock pulse that the counter value decreases, digital counter 114 also provides an output signal data_o that cause adjustable current sink 110 to decrease the amount of current sunk, effectively increasing voltage Vdiv_sig.

Furthermore, when the outputs of both high speed comparators 112a, 112b are low, i.e., when Vdiv_sig is within the defined voltage window, digital counter 114 will not adjust its internal counter value at each clock pulse. Rather it will be latched placing modulator 100 in a steady state. Meaning, output signal data_o of digital counter 114 will not be adjusting the amount of current sunk by adjustable current sink 110.

Finally, digital counter 114 also comprises data output 118 provided to output a signal add_pause_o. Specifically, data output 118 is provided to output the actual data, i.e., binary logic 0s and 1s identified by the amplitude of the analog carrier signal, that is received as a voltage by antenna 102a, 102b and demodulated by demodulator 100 using the aforementioned techniques. It should be further understood that output add_pause_o may be coupled to a microprocessor or the like of the contactless device in order to process the data according to the device's application.

Figure 2:
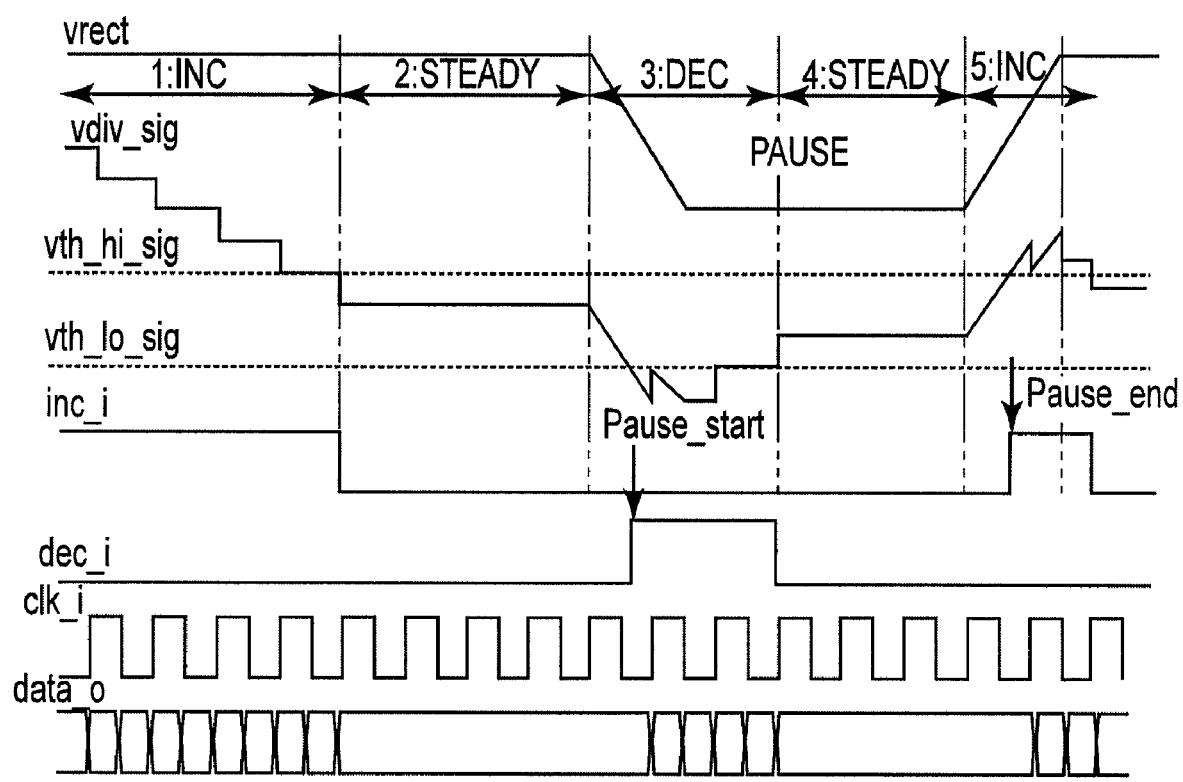
FIG. 2 illustrates a timing diagram in accordance with an exemplary embodiment.

To help further demonstrate the operation of modulator 100, FIG. 2 shows a timing diagram in accordance with the exemplary embodiment. Specifically, FIG. 2 shows an example of the voltage received by the antenna 102a, 102b of a contactless device and how modulator 100 interprets and regulates this voltage. As should be understood and as will be discussed below, the exemplary data signals shown in the timing diagram of FIG. 2 correspond to Type A communication signal interfaces as described by ISO 14443. It is noted, however, that modulator 100 is not limited to this specific communication signal interface, but rather can support other data modulation such as Type B or Type C standard data modulation as described by ISO 14443.

Referring to FIG. 2, "Vrect" represents an envelope of the carrier signal received by the antenna 102a, 102b of the contactless device, i.e., an amplitude of the received voltage signal. Moreover, as noted above, Vdiv_sig represents an output voltage of series resistor 108 described in FIG. 1, which is a rectified voltage of the received voltage signal. As shown in the timing diagram of FIG. 2, Vdiv_sig is initially outside the voltage window defined by Vth_hi_sig and Vth_lo_sig. More particularly, voltage Vdiv_sig is greater than the high voltage threshold defined by Vth_hi_sig. As a result, the output signal data_inc_o of high threshold level comparator 112b is a high signal. This output is concurrently input to digital counter 114 as a signal represented by "inc_i" of digital counter 114. In response to this signal, digital counter 114 increases its internal counter value at each clock pulse. As shown in the timing diagram, data output value data_o is also output in accordance with a clock signal clk_i. Because data output value data_o directly depends on the counter value, the amount of current sunk by adjustable current sink 110 also increases as a result thereof. The counter value, and correspondingly, the amount of sunk current, continue to increase as long as Vdiv_sig is greater than Vth_hi_sig. By increasing the current sunk by adjustable current sink 110, voltage Vdiv_sig is effectively reduced until it falls within the voltage window. This step of the regulation process is shown as Phase 1:INC.

Once voltage Vdiv_sig is within the voltage window, voltage Vdiv_sig reaches a steady state as shown in Phase 2:STEADY of the timing diagram. Meaning, once voltage Vdiv_sig is no longer greater that the high voltage threshold Vth_hi_sig, the output of high threshold level comparator 112b is no longer high. As shown in the timing diagram, corresponding input inc_i of digital counter 114 also switches from high to low. As a result, the counter value is latched such that the amount of current sunk by current sink 110 is no longer being increased. Accordingly, demodulator 100 reaches a steady state.

As mentioned above, the exemplary timing diagram of FIG. 2 is using a modulated data signal representative of the data modulation techniques employing the protocol defined by the ISO 14443 Type A standard. Specifically, Type A has an amplitude shift keying ("ASK") of 100% Reader to Card modulation index, meaning that data is coded with short pauses in the transmission. A single bit of data is coded as a field pause in the transmission. During these pauses, no power is transmitted to the card.

Phase 3:DEC corresponds to a field pause in accordance with Type A modulation. Because no power is being transmitted during the pause, the amplitude of the voltage signal received by the antenna 102a, 102b decreases, and, therefore, rectified voltage Vrect decreases as a result thereof. Since Vdiv_sig is directly dependent on Vrect, this voltage also decreases, falling below the low voltage threshold Vth_lo_sig of the voltage window. Once Vdiv_sig is below Vth_lo_sig, low threshold level comparator 112a outputs a high signal data_dec_o. This signal is input to digital counter 114 as input signal dec_i. The switching of dec_i from a low to high signal can be used by modulator 100 to detect the beginning of a field pause. In addition, while input signal dec_i is high, digital counter 114 will decrease its internal counter value at each clock pulse. As discussed above, the output value data_o of digital counter 114 is directly dependent on the counter value. As a result, the reduction in the counter value causes the output value data_o to reduce the amount of current sunk by current sink 110. Accordingly, as shown in Phase 3:DEC of the timing diagram, voltage Vdiv_sig is effectively increased. This process continues until Vdiv_sg is adjusted to be within the voltage window defined by Vth_hi_sig and Vth_lo_sig. Once Vdiv_sig is within the voltage window, the output data_dec_o of low threshold level comparator 112a will becomes low, as shown by dec_i in FIG. 2. As such, the counter value will also be latched again and modulator 100 will again enter into a steady state as shown in Phase 4:STEADY.

Finally, when the field pause is complete, rectified voltage Vrect will again increase causing voltage Vdiv_sig to also increase. This result is shown in Phase 5:INC. Once Vdiv_sig increases to be greater than the high voltage threshold defined by Vth_hi_sig, demodulator 100 will perform the same operation as that described above with respect to Phase 1:INC, driving voltage Vdiv_sig back into the voltage window. It is further noted that when input signal inc_i of digital counter 114 increases from a low signal to a high signal, the rising edge of input signal inc_i can be used by modulator 100 to detect the end of the field pause in the modulated signal received by the antenna 102a, 102b.

Figure 3:
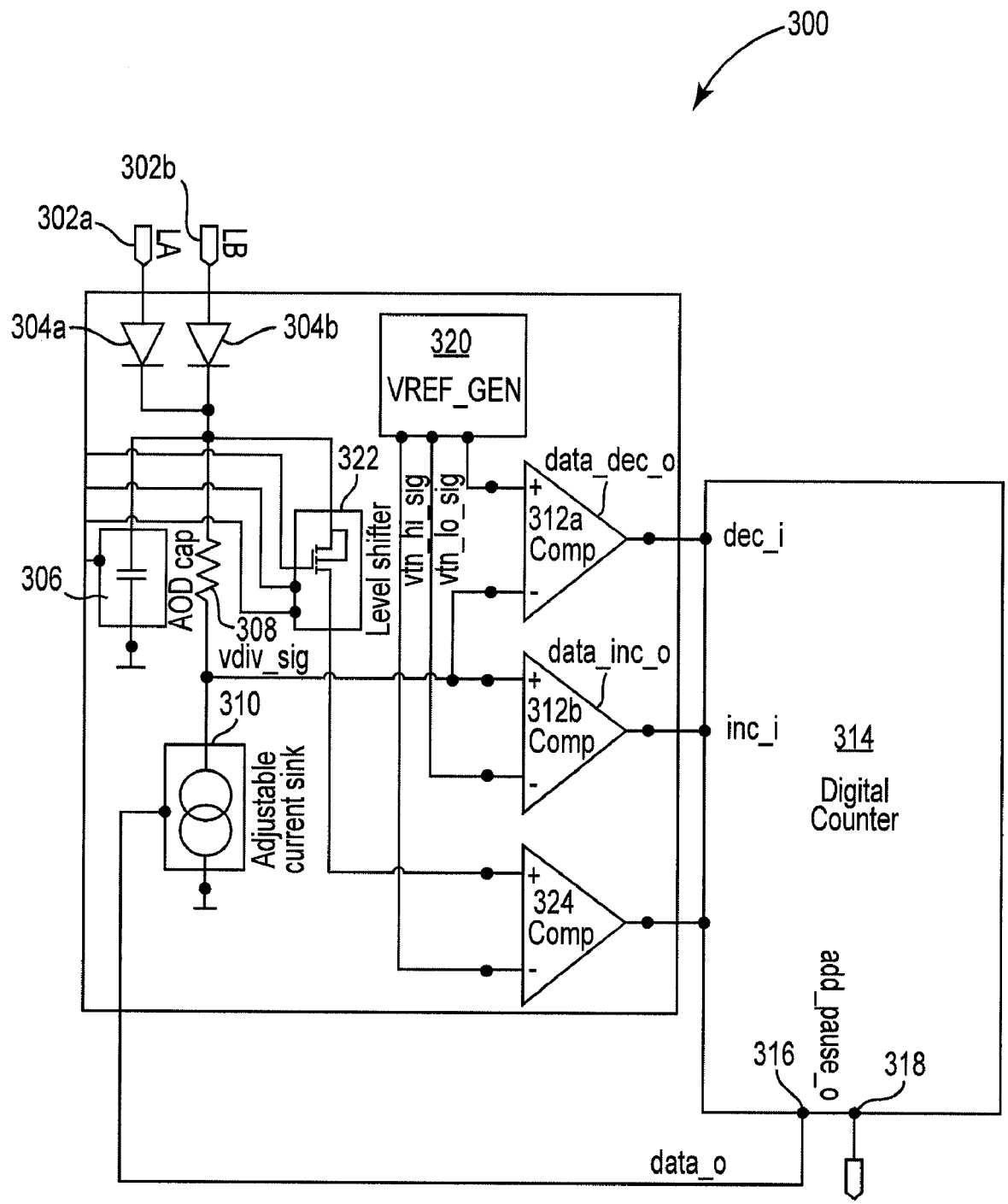
FIG. 3 illustrates a detailed block diagram in accordance with an exemplary embodiment.

FIG. 3 shows a detailed block diagram in accordance with the present invention. Essentially, FIG. 3 is a more detailed representation of the exemplary embodiment as shown in FIG. 1. Demodulator 300, however, includes additional analog components not shown in FIG. 1 that demonstrate available implementation details. As shown, demodulator 300 comprises an antenna 302a, 302b; rectifier 304a, 304b; a filter capacitor 306; a series resistor 308; an adjustable current sink 310; two high speed comparators 312a, 312b; and digital counter 314. As should be clear, these components correspond to those of demodulator 100 described above with respect to FIG. 1.

Furthermore, demodulator 300 comprises reference voltage generation circuit 320, level shifter 322, and a third comparator 324. Specifically, reference voltage generation circuit 320 is configured to generate at least one reference voltage for demodulator 300. For example, reference voltage generation circuit 320 can be used to define the voltage window by generating Vth_hi_sig and Vth_lo_sig. It is noted that reference voltage generation circuit 320 can be powered by the electromagnetic field derived from the carrier signal once converted to DC voltage, although this embodiment should not be limited in any way to this design implementation.

Moreover, reference voltage generation circuit 320 can generate a pause end threshold voltage that is provided to the inverting input of the third comparator 324. Level shifter 322 is provided to adjust the voltage received by antenna 302a, 302b by an offset and output this adjusted voltage to the non-inverting input of comparator 324. Accordingly, the third comparator is provided to compare the pause end threshold voltage received from reference voltage generation circuit 320 with the offset voltage provided by level shifter 322.

When certain modulation communication techniques, such as Type A standard data modulation at a speed of 106 Kbps, are employed between a reader and contactless card, the carrier signal may have a very deep modulation, meaning the amplitude of the field pause signal is very deep. Additionally, in some case, it can be very difficult to detect the end of the field pause. Accordingly, third comparator 324 may be used to enable modulator 300 detect the end of the field pause in such circumstances. The pause end threshold voltage generated by reference voltage generation circuit 320 will be much smaller than either Vth_hi_sig and/or Vth_lo_sig. Accordingly, when the offset voltage output by level shifter 322 is greater than the pause end threshold voltage, comparator 324 outputs a low signal. As a result, digital counter 314 is able to interpret this signal and to recognize that the field pause has ended. Again, it is reiterated this feature is not necessary for operation of modulator 100 as described above with respect to FIG. 1, but rather provides an additional aspect to enable the demodulation of certain data signals.

Figure 4:
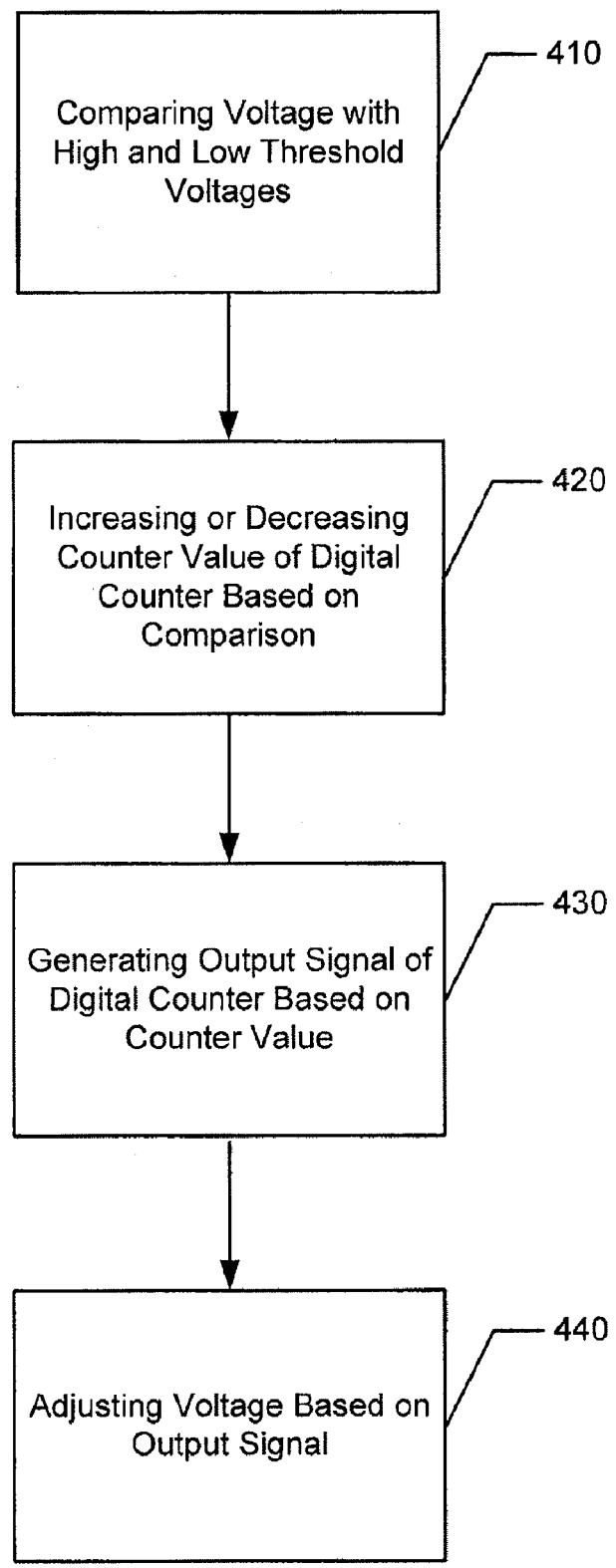
FIG. 4 illustrates a flowchart for a method for adaptive modulation.

It is noted that, similarly to demodulator 100, digital counter 314 also comprises data output 318 provided to output a signal add_pause_o. Data output 318 is provided to output the actual data, i.e., binary logic 0s and 1s identified by the amplitude of the analog carrier signal, that is received as a voltage by antenna 302a, 302b and demodulated by demodulator 300 using the aforementioned techniques. As described above with respect to FIG. 1, output add_pause_o may be coupled to a microprocessor or the like of the contactless device in order to process the data according to the device's application. Furthermore, this embodiment is also not intended to be limited to the use of a digital counter. Rather, any digital device or circuitry capable of adjusting the amount of current sunk by adjustable current sink 310 may be utilized for this purpose FIG. 4 shows a flowchart for a method for adaptive modulation 400 in accordance with an exemplary embodiment. In Step 410, a voltage V_div_sig, which is dependent on a rectified voltage corresponding to a signal received by a contactless device, is compared with threshold voltages Vth_hi_sig and Vth_lo_sig, which define a voltage window of a regulation loop. Next, at Step 420, the internal counter value of digital counter 114 is increased or decreased at each clock pulse, depending on whether Vdiv_sig is greater than Vth_hi_sig or less than Vth_lo_sig, respectively. At Step 430, digital counter 114 generates an output signal based on the counter value. Finally, at Step 440, voltage Vdiv_sig is adjusted by adjustable current sink 110 as a result of the output signal.

Figure 5:
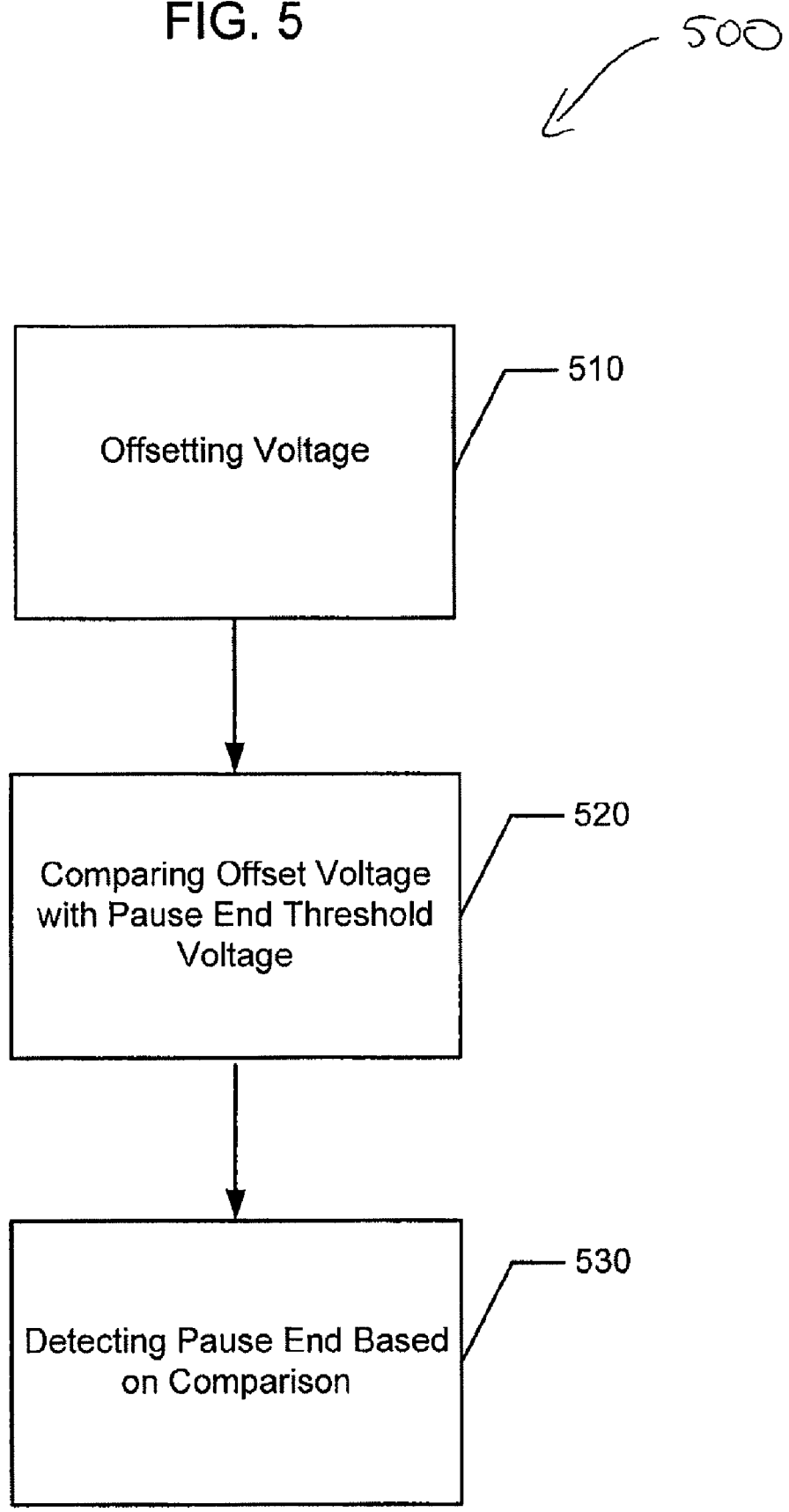
FIG. 5 illustrates a flowchart for a method for detecting the end of a field pause for a modulated data signal.

Finally, FIG. 5 shows a flowchart for a method for detecting the end of a field pause 500 for a modulated data signal having very deep modulation amplitudes. In Step 510, a voltage V_div_sig, which is dependent on a rectified voltage corresponding to a signal received by a contactless device, is offset by a level shifter 322. Next, at Step 520, the offset voltage is compared with a pause end threshold voltage generated by a reference voltage generation circuit 320. Finally, modulator 300 detects the end of a field pause based on the result of the comparison between the offset voltage and the pause end threshold voltage.

While the foregoing has been described in conjunction with an exemplary embodiment for a demodulator of a contactless device, it is understood that the term "exemplary" is merely meant as an example, rather than the best or optimal. Accordingly, the application is intended to cover alternatives, modifications and equivalents, which may be included within the spirit and scope of the invention. For example, any electronic device necessitating a demodulator for amplitude demodulation of a carrier signal is intended to be within the scope of the application, including, but not limited to, contactless cards or card readers.

Additionally, in the preceding detailed description, numerous specific details have been set forth in order to provide a thorough understanding of the present invention. However, it should be apparent to one of ordinary skill in the art that the present invention may be practiced without these specific details. In other instances, well-known methods, procedures, components, and circuits have not been described in detail so as not to unnecessarily obscure aspects of the present invention.

The invention claimed is:

1. An adaptive demodulator for a contactless device, comprising:
   a rectifier configured to rectify a voltage which is dependent on a carrier signal received by the contactless device; and
   a voltage regulator configured to adjust the rectified voltage to be within a voltage window, and to generate a data stream based on the rectified voltage,
   wherein the data stream represents data modulated with the carrier signal.

2. The adaptive demodulator of claim 1, wherein the voltage regulator comprises:
   a high threshold comparator coupled to the rectifier and configured to compare the rectified voltage with a high threshold voltage; and
   a low threshold comparator coupled to the rectifier and configured to compare the rectified voltage with a low threshold voltage, wherein the high and low threshold voltages define the voltage window.

3. The adaptive demodulator of claim 2, wherein the voltage regulator further comprises:
a clock configured to generate clock pulses; and
a counter coupled to the high and low threshold comparators, and configured to increase a counter value for each clock pulse when the rectified voltage is greater than the high threshold voltage and decrease the counter value for each clock pulse when the rectified voltage is less than the low threshold voltage, and to output an output signal based on the counter value.

4. The adaptive demodulator of claim 2, wherein the voltage regulator further comprises:
a clock configured to generate clock pulses; and
a counter coupled to the high and low threshold comparators, and configured to maintain a counter value for each clock pulse when the rectified voltage is less than the high threshold voltage and greater than the low threshold voltage.

5. The adaptive demodulator of claim 3, wherein the voltage regulator further comprises an adjustable current sink coupled to the rectifier and to the counter, and configured to adjust the rectified voltage based on the output signal.

6. The adaptive demodulator of claim 3, wherein the voltage regulator further comprises an operational amplifier coupled to the rectifier and to the counter, and configured to adjust the rectified voltage based on the output signal.

7. The adaptive demodulator of claim 2, wherein a start of a field pause is detected when the rectified voltage falls below the low threshold voltage.

8. The adaptive demodulator of claim 2, wherein an end of a field pause is detected when the rectified voltage rises above the high threshold voltage.

9. The adaptive demodulator of claim 1, wherein the contactless device is a contactless card.

10. The adaptive demodulator of claim 1, wherein the contactless device is a contactless reader.

11. The adaptive demodulator of claim 3, further comprising:
a level shifter configured to offset the rectified voltage; and
a further comparator coupled between the level shifter and the counter, and configured to compare the offset voltage with a pause end threshold voltage,
wherein an output of the further comparator indicates an end of a field pause.

12. The adaptive demodulator of claim 11, further comprising a reference voltage generator configured to generate at least one of the high threshold voltage, the low threshold voltage, and the pause end threshold voltage.

13. The adaptive demodulator of claim 2, further comprising a reference voltage generator configured to generate at least one of the high threshold voltage and the low threshold voltage.

14. An adaptive demodulator for a contactless device, comprising:
a rectifier means for rectifying a voltage which is dependent on a carrier signal received by the contactless device; and
a voltage regulating means for adjusting the voltage to be within a voltage window, and for generating a data stream based on the rectified voltage,
wherein the data stream represents data modulated with the carrier signal.

15. An adaptive demodulating method for a contactless device, the method comprising:
rectifying a voltage which is dependent on a carrier signal received by the contactless device;
adjusting the rectified voltage to be within a voltage window; and
generating a data stream based on the rectified voltage, the data stream representing data modulated with the carrier signal.

16. The adaptive demodulating method of claim 15, wherein the adjusting comprises:
comparing the rectified voltage with a high threshold voltage; and
comparing the rectified voltage with a low threshold voltage,
wherein the high and low threshold voltages define the voltage window.

17. The adaptive demodulating method of claim 16, wherein the adjusting further comprises:
generating clock pulses;
increasing a counter value for each clock pulse when the rectified voltage is greater than the high threshold voltage;
decreasing the counter value for each clock pulse when the rectified voltage is less than the low threshold voltage; and
generating an output signal based on the counter value.

18. The adaptive demodulating method of claim 16, wherein the adjusting further comprises:
generating clock pulses; and
maintaining a counter value for each clock pulse when the rectified voltage is less than the high threshold voltage and greater than the low threshold voltage.

19. The adaptive demodulating method of claim 17, wherein the adjusting further comprises adjusting the rectified voltage based on the output signal.

20. The adaptive demodulating method of claim 16, further comprising detecting a start of a field pause when the rectified voltage falls below the low threshold voltage.

21. The adaptive demodulating method of claim 16, further comprising detecting an end of a field pause when the rectified voltage rises above the high threshold voltage.

22. The adaptive demodulating method of claim 15, wherein the contactless device is a contactless card.

23. The adaptive demodulating method of claim 15, wherein the contactless device is a contactless reader.

24. The adaptive demodulating method of claim 17, further comprising:
offsetting the rectified voltage; and
comparing the offset voltage with a pause end threshold voltage,
wherein an output of the further comparator indicates an end of a field pause.

25. The adaptive demodulating method of claim 24, further comprising generating at least one of the high threshold voltage, the low threshold voltage, and the pause end threshold voltage.

* * * * *